United States Patent [19]
Yoon et al.

[11] Patent Number: 5,862,197
[45] Date of Patent: Jan. 19, 1999

[54] CHARGE COUPLED DEVICE HAVING CCIR/EIA MODE COVERSION FUNCTION

[75] Inventors: Sung Hyuk Yoon; Il Nam Hwang, both of Seoul, Rep. of Korea

[73] Assignee: LG Semicon Co., Ltd., Chungcheongbuk-do, Rep. of Korea

[21] Appl. No.: 870,630

[22] Filed: Jun. 6, 1997

[30] Foreign Application Priority Data

Jun. 10, 1996 [KR] Rep. of Korea .................. 20637/1996

[51] Int. Cl.⁶ .......................... G11C 19/28; H01L 27/148; H01L 29/768
[52] U.S. Cl. ............................. 377/61; 257/233; 257/246; 257/250
[58] Field of Search ..................................... 257/231–233, 257/246, 250; 377/61

[56] References Cited

U.S. PATENT DOCUMENTS 4,856,033  8/1989  Hirota ....................................... 257/232
5,723,884  3/1998  Kim ......................................... 257/233

*Primary Examiner*—Gene M. Munson

[57] ABSTRACT

A charge coupled device having a CCIR/EIA mode conversion function includes: a plurality of VCCD regions formed in the direction of row, the VCCD regions having a predetermined interval from one another; a plurality of HCCD regions formed at the end of the VCCD regions in the direction of column; a plurality of photodetectors regularly arranged between the VCCD regions, the photodetectors generating signal charges according to an image signal; a plurality of vertical gate electrodes formed on the VCCD regions and the photodetectors in the direction of column, the vertical gate electrodes transmitting the signal charges of the photodetectors to the HCCD regions through the VCCD regions according to applied vertical clock signals; vertical clock signal generator for supplying a predetermined number of vertical clock signals; and a selecting portion for receiving vertical clock signals from the vertical clock signal generator, the selecting portion supplying the vertical clock signals to part of the vertical gate electrodes, or supplying disable signals instead of the vertical clock signals, according to an external selection signal.

3 Claims, 9 Drawing Sheets

CHARGE COUPLED DEVICE HAVING CCIR/ EIA MODE COVERSION FUNCTION

BACKGROUND OF THE INVENTION

The present invention relates to a semiconductor device, and more particularly, to a charge coupled device (CCD) having a CCIR/EIA mode conversion function.

Generally, for a CCD image sensor, there are a frame transfer mode, an interline transfer mode, and a frame interline transfer mode formed in combination with the aforementioned two modes, according to the reading mode of signal charges. The interline transfer mode is divided into an EIA (Electronic Industries Association) and CCIR (Consultative Committee International Radio) modes according to a scanning mode. FIGS. 1A and 1B show the optical black regions of the EIA and CCIR modes, respectively. In the EIA mode CCD having 250,000 pixels, effective pixels are 510(H)×492(V), and its optical black region has the size of 25+2 horizontally (H) and 12+1 vertically (V). Accordingly, the total number of the pixels are 537(H)×505(V). On the other hand, in the CCIR mode CCD having 290,000 pixels, effective pixels are 500(H)×582(V), and its optical black region has the size of 30+7 horizontally (H) and 14+1 vertically (V). Accordingly, the total number of the pixels are 537(H)×597(V).

FIGS. 2A and 2B are diagrams showing horizontal synchronous driving timings of the EIA and CCIR modes. In an EIA mode CCD, scanning is performed with 262(H) and 263(H) horizontal lines in even and odd fields for 1/60 seconds. In a CCIR mode CCD, scanning is performed with 312(H) and 313(H) horizontal lines in even and odd fields for 1/50 seconds. Accordingly, the vertical synchronous driving timings (not shown) of the EIA and CCIR modes are different from each other. Since the number of the effective pixels of the two modes in the horizontal lines are different from each other as shown in FIGS. 1A and 1B, their horizontal synchronous timings are also different from each other as shown in FIGS. 2A and 2B. In other words, the driving clock timings of the CCIR and EIA modes are different from each other.

In case that their driving timings are different from each other, if the driving clock timing of the CCIR mode is applied to the EIA mode, the timing is not enough for all the charges accumulated in the pixels of CCD used in the CCIR mode to be transmitted to a vertical charge transfer region. As a result, this affects image reproduction in CCD.

FIG. 3 is a layout of a conventional CCD. Referring to FIG. 3, gates are formed on a substrate which includes a plurality of photodiode (PD) regions, a plurality of vertical charge transfer (VCCD) regions for vertically transmitting image signal charges generated from the respective photodiodes, and a horizontal charge transfer region (HCCD) formed on one side of the VCCD region. That is, a plurality of first polysilicon gates 31 and second polysilicon gates 32 are alternately formed on the VCCD regions. First and second polysilicon gates 31 and 32 sequentially transmit the image signal charges generated from the photodiodes. Here, one side of second polysilicon gate 32 is formed to be superposed on the photodiode region, to be thereby used as a transfer gate.

In first and second polysilicon gates 31 and 32 formed on the VCCD region, a clock signal $V_{\phi 2}$ is applied to the first polysilicon gate 31, a clock signal $V_{\phi 1}$ to the second polysilicon gate 32, a clock signal $V_{\phi 4}$ to the next first polysilicon gate, and a clock signal $V_{\phi 3}$ to the next second polysilicon gate. By doing so, the first and second polysilicon gates transmit the image signal charges sequentially and vertically. That is, the transfer operation of the image signal charges is carried out in 4-phase clocking.

A plurality of first and second polysilicon gates 31a and 32a are formed on the HCCD region. First and second polysilicon gates 31a and 32a transmit the image signal charges, which are transmitted from the VCCD region in 2-phase clocking, to a sensing amplifier. This sensing amplifier converts the image signal charges into an image signal, what is output in turn. Clock signals $H_{\phi 1}$ and $H_{\phi 2}$ are alternately applied to first and second polysilicon gates 31a and 32a formed on the HCCD region. By doing so, first and second polysilicon gates 31a and 32a sequentially transfer the image signal charges.

As described above, in the conventional CCD, the potential level of the image signal charges generated from the respective pixel regions is changed according to the clock signals $V_{\phi 1}$, $V_{\phi 2}$, $V_{\phi 3}$, and $V_{\phi 4}$, and then the image signal charges are transmitted vertically. This image signal charges are transmitted to a floating gate region according to the clock signals $H_{\phi 1}$ and $H_{\phi 2}$ and converted into an analog signal through the sensing amplifier. The vertical and horizontal transfer of the image signal charges of the conventional CCD is carried out according to the respective transfer clock signals. However, in case that the CCIR mode CCD is used for the EIA mode, the driving clock timing of the EIA mode is faster than that of the CCIR mode. Accordingly, compared with the CCD used in the EIA mode, charges accumulated in many pixels of the CCD used for the CCIR mode cannot be transmitted to the VCCD regions. Here, the charges, which can not be transmitted to the VCCD region, are transmitted according to the next clock signal. These charges are overlapped with the charges of the previous pixel. As a result, images are overlapped with each other during image display.

The above-described conventional CCD has the following problems. Since the number of pixels of CCD according to the respective scanning modes are different from each other, one kind of CCD cannot be used in both EIA and CCIR modes. Accordingly, it is required that the CCD is changed according to its scanning mode.

SUMMARY OF THE INVENTION

It is an object of the present invention to provide a CCD having a CCIR/EIA mode conversion function, in which one kind of CCD is used for both EIA and CCIR modes.

To accomplish the above and other objects of the present invention, there is provided a charge coupled device having a CCIR/EIA mode conversion function, including: a plurality of VCCD regions formed in the direction of row, the VCCD regions having a predetermined interval from one another; a plurality of HCCD regions formed at the end of the VCCD regions in the direction of column; a plurality of photodetectors regularly arranged between the VCCD regions, the photodetectors generating signal charges according to an image signal; a plurality of vertical gate electrodes formed on the VCCD regions and the photodetectors in the direction of column, the vertical gate electrodes transmitting the signal charges of the photodetectors to the HCCD regions through the VCCD regions according to applied vertical clock signals; vertical clock signal generator for supplying a predetermined number of vertical clock signals; and a selecting portion for receiving vertical clock signals from the vertical clock signal generator, the selecting portion supplying the vertical clock signals to part of the vertical gate electrodes, or supplying disable signals instead of the vertical clock signals, according to an external selection signal.

BRIEF DESCRIPTION OF THE ATTACHED DRAWINGS

The novel features believed characteristic of the invention, as well as other features and advantages thereof, will best be understood by reference to the following detailed description of a particular embodiment, read in conjunction with the accompanying drawings, wherein.

DETAILED DESCRIPTION OF PREFERRED EMBODIMENTS

Figure 1A:
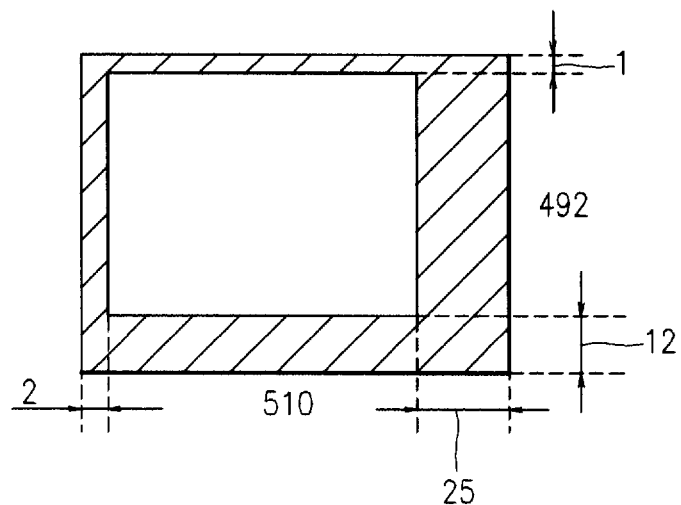
FIGS. 1A and 1B show optical black regions of a conventional CCD with EIA and CCIR modes, respectively.
Figure 1B:
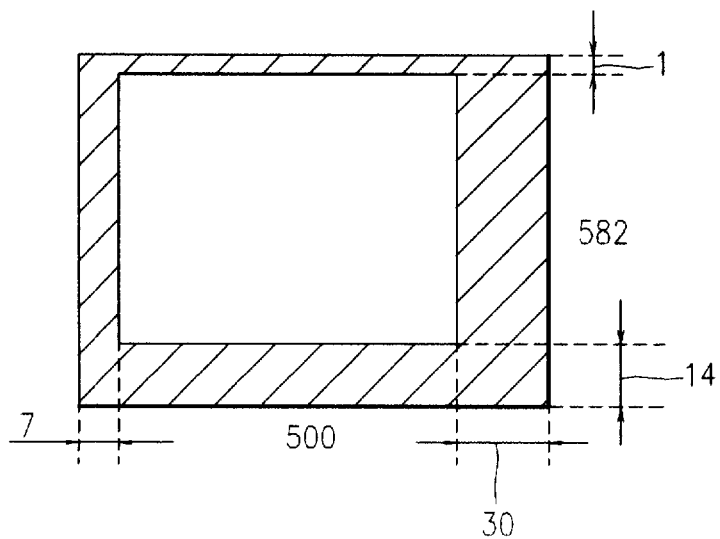
Figure 2A:
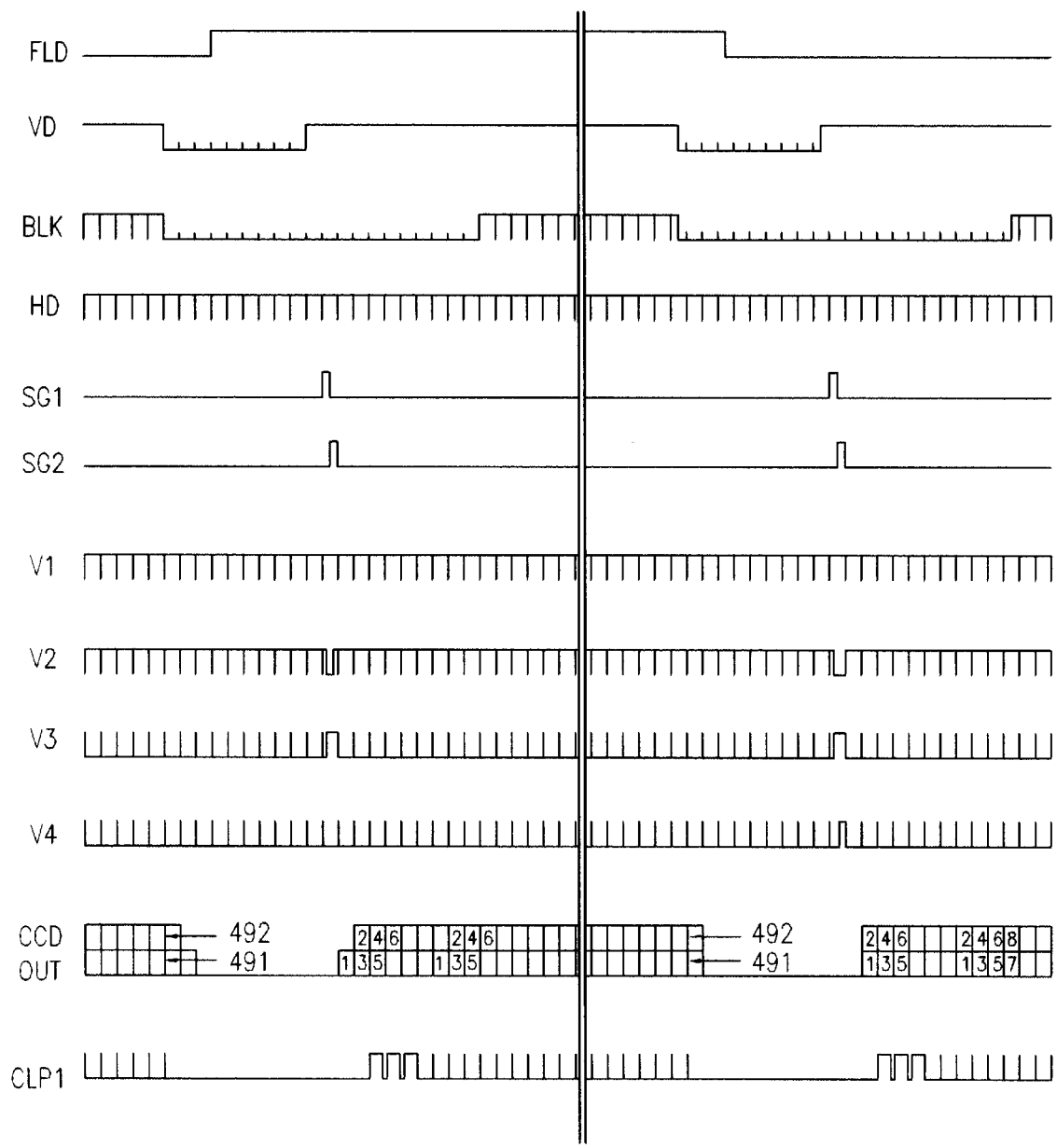
FIG. 2A and 2B are timing diagrams showing horizontal synchronous driving timings of EIA and CCIR modes, respectively.
Figure 2B:
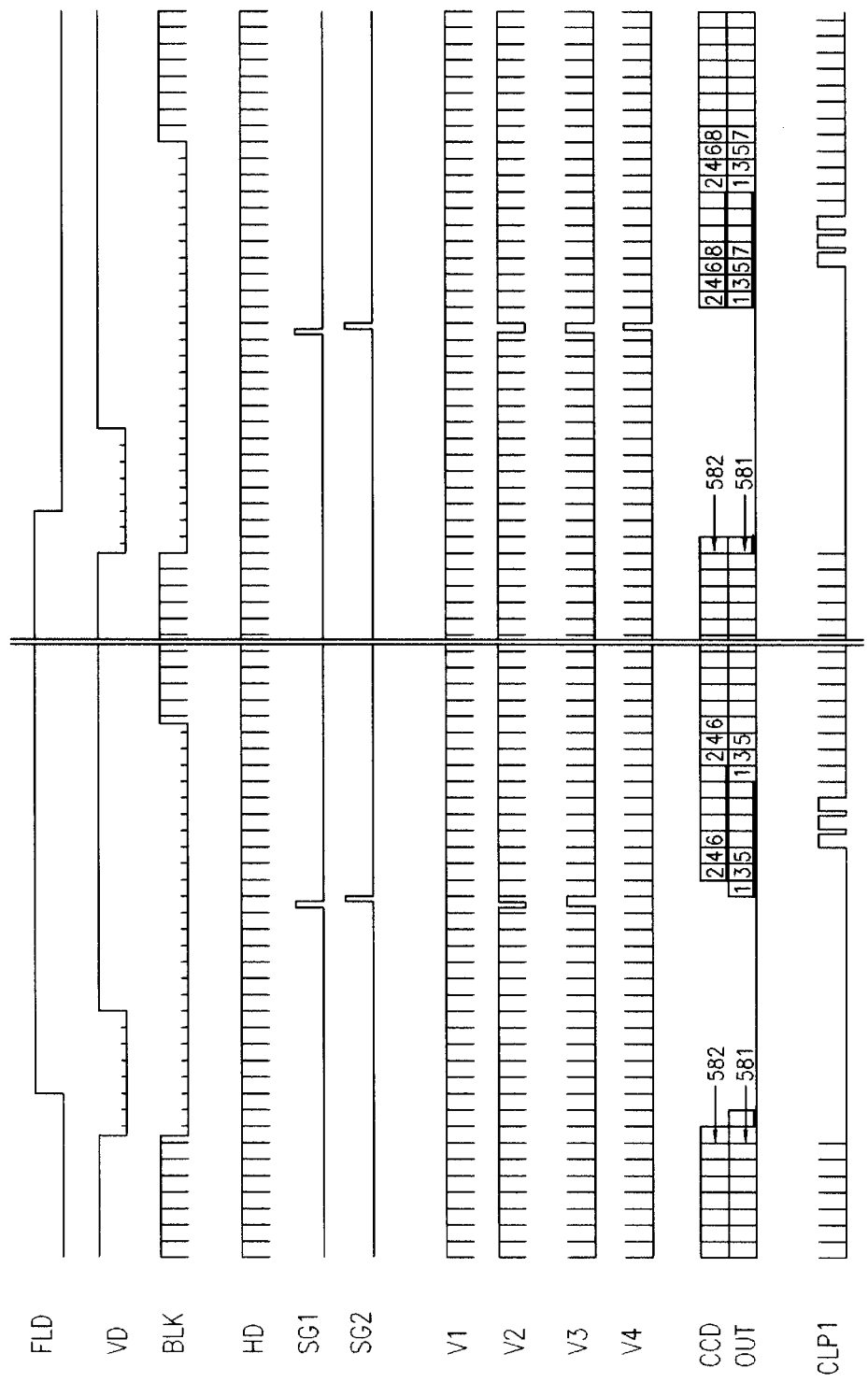
Figure 3:
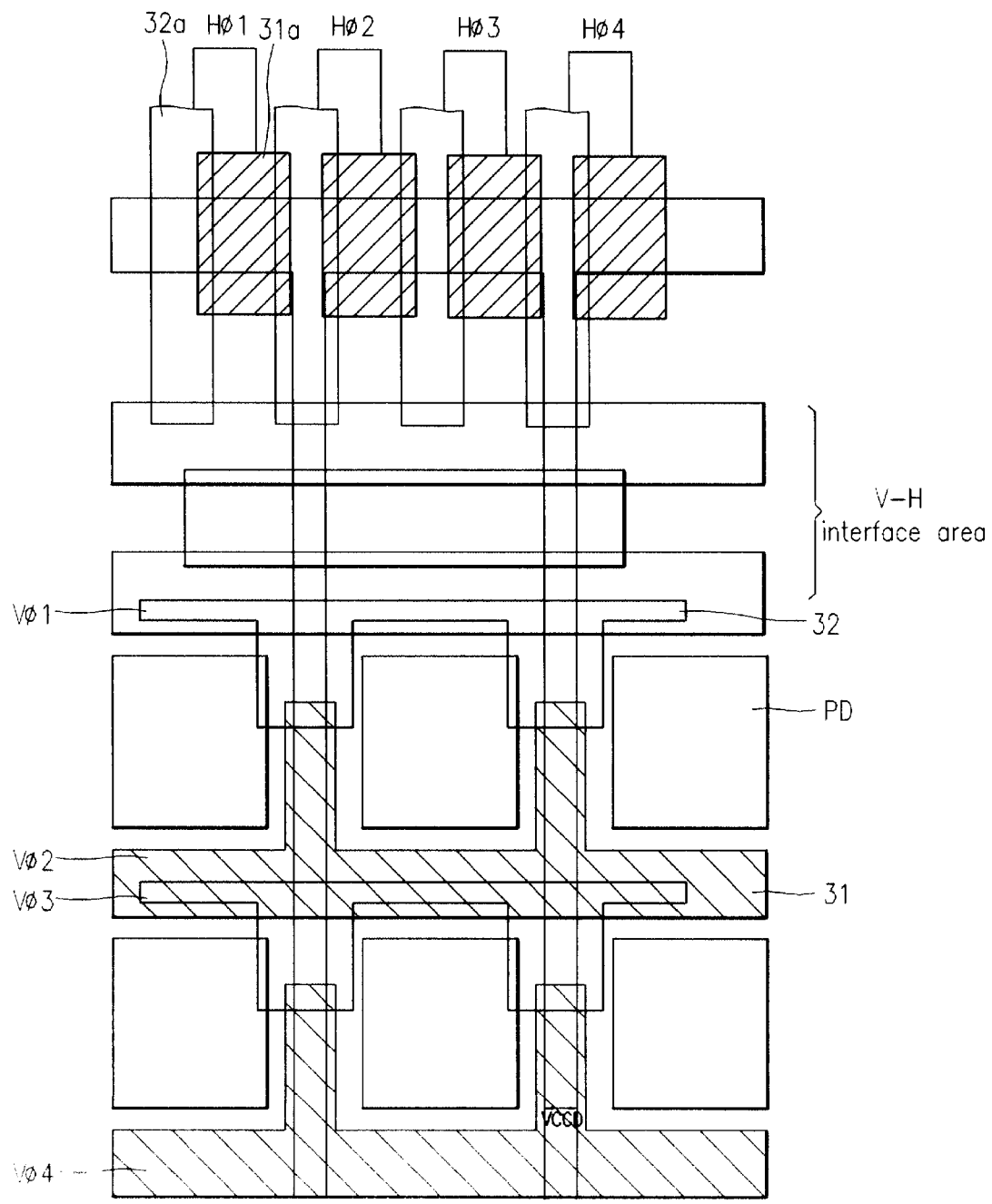
FIG. 3 is a layout of a conventional CCD.
Figure 4:
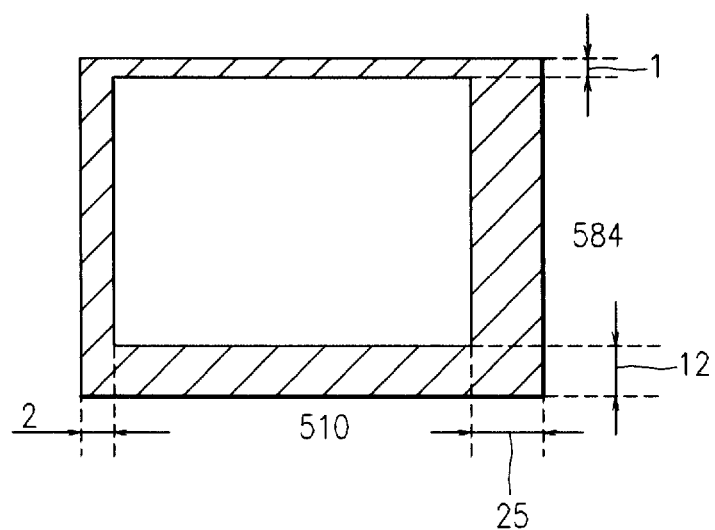
FIG. 4 shows an optical black region of a CCD according to the present invention.

A preferred embodiment of the present invention will be explained below with reference to the accompanying drawings. FIG. 4 shows an optical black region of a CCD according to the present invention. The CCD of the present invention uses the CCIR mode having 290,000 pixels. That is, the total number of the pixels are 537(H)×597(V), which is as many as that of the CCD used in the CCIR mode. The optical black region has pixels of 25+2 lines horizontally and of 12+1 lines vertically. Accordingly, the number of effective pixels is 510(H)×584(V).

Figure 5:
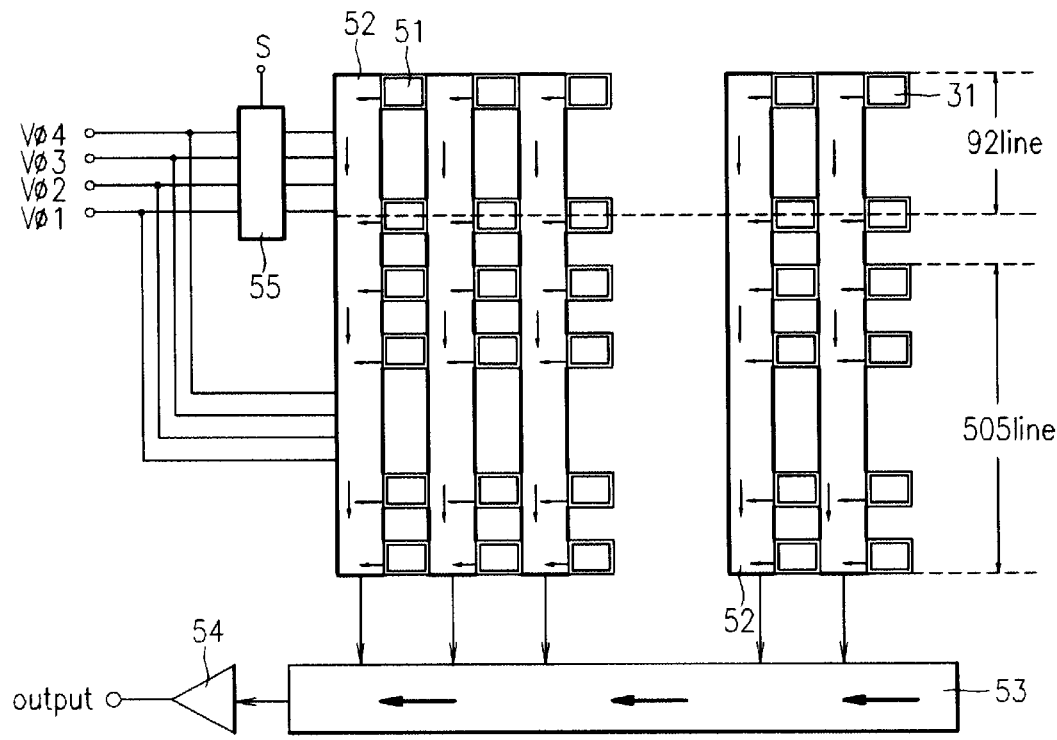
FIG. 5 shows a structure and signal flowing path of a CCD according to the present invention.

FIG. 5 shows a structure and signal flowing path of the CCD according to the present invention. Referring to FIG. 5, the CCD of the present invention includes a photodiode (PD) region 51, VCCD region 52, HCCD region 53, sensing amplifier (SA) 54 and vertical transfer clock selecting portion 55. Photodiode region 51 converts a light signal entered through a microlens to an electric image charge signal. VCCD region 52 transmits the image charges formed in photodiode region 51 vertically. HCCD region 53 horizontally transmits the image charges which are transmitted vertically. Sensing amplifier 54 senses the image charge signal transmitted horizontally, and outputs it. Vertical transfer clock selecting portion 55 controls a vertical transfer clock signal for transmitting the charges from the spare pixels to VCCD region 52. The control of the vertical transfer clock signal is carried out by turning on/off vertical transfer clock selecting portion 55 using a selection signal according to a user's mode selection as an input.

The CCIR mode CCD has the total number of vertical pixel lines larger than that of EIA mode CCD. Accordingly, in order to use the CCIR mode CCD for the EIA mode, it is required to control the CIR mode CCD having the number of pixels larger than that of EIA mode. As a result, vertical transfer clock selecting portion 55 controls the spare pixel lines of the CCIR mode CCD.

That is, the CCD of the present invention has 597 pixel lines in total vertically. On the other hand, the CCD used for EIA mode has 505 pixels in total vertically. Accordingly, the CCD used for CCIR mode has 92 lines more than the CCD used for EIA mode in terms of the total number of pixel lines. Also, the CCD used for CCIR mode has 92 lines more than CCD used for EIA mode in terms of the number of effective pixels. Accordingly, in order to use the CCD used for CCIR mode for EIA mode, 92 lines of pixels are appropriately controlled vertically, the clock frequency of the system is changed, and the modes of timing generator and signal processor are converted.

In other words, the number of effective pixel lines of the CCD, which is used for EIA mode, is 492 vertically. The number of effective pixel lines of the CCD of the present invention is 584 vertically. Accordingly, in order to apply the CCD of the present invention to the EIA mode CCD, it is required that the CCD of the present invention is controlled starting from the 493rd line. Here, vertical transfer selecting portion 55 controls the vertical transfer clock signal for transmitting the charges from photodiode region 51 of the CCD to VCCD region 52.

Figure 6:
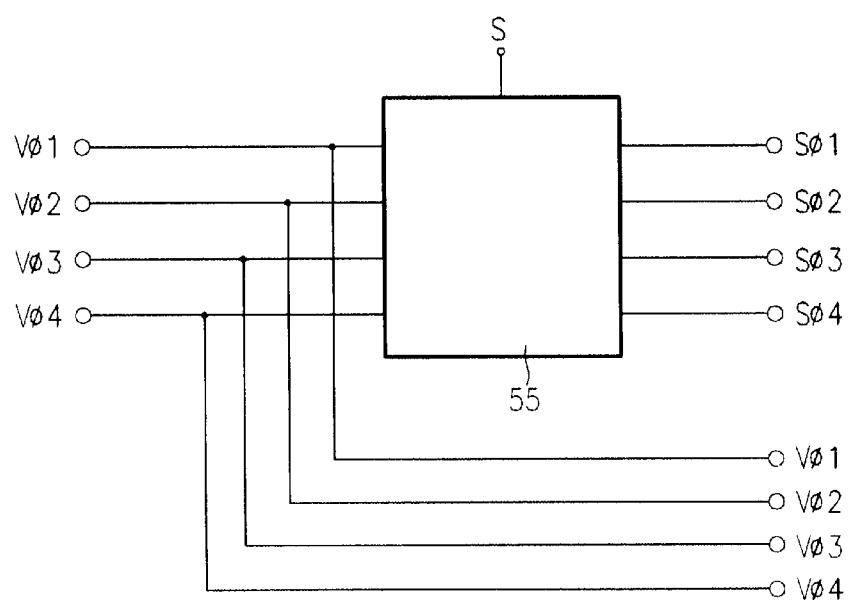
FIG. 6 is an explanatory diagram for explaining the operation of a vertical transfer clock selecting portion of the CCD according to the present invention.

FIG. 6 is an explanatory diagram for explaining the operation of the vertical transfer clock selecting portion according to the present invention. Referring to FIG. 6, vertical transfer clock selecting portion 55 determines output states $S_{\phi 1}$–$S_{\phi 4}$ according to the CCIR or EIA scanning mode using vertical transfer clock signals $V_{\phi 1}$–$V_{\phi 4}$ as an input according to an external selection signal S. Here, the external selection signal selects either CCIR mode or EIA mode. In order to use the CCD used for CCIR mode for EIA mode, charges are prevented from being moved from the spare pixels to VCCD region 52 by controlling the vertical transfer clock signal required to move charges from the spare pixels of 92 lines to VCCD region 52. Here, transfer gates are connected to respective vertical transfer clock signal $V_{\phi 1}$–$V_{\phi 4}$, and thus the transfer clock signal from the 493rd line is controlled with the output of the transfer gate. Otherwise, the transfer gate may be replaced with a switch includes a CMOS transistor. By doing so, the transfer clock from the 493rd line is controlled according to the output signal of the switch. Here, if the output of the transfer gate is logic "high", the vertical transfer clock signal is applied to the whole pixel lines including the spare 92 lines. If the output of the transfer gate is logic "low", the vertical transfer clock signal is not applied to the spare 92 lines. Accordingly, in case that the output of the transfer gate is logic "low", there is no charge moved from the spare pixel to VCCD region 52.

Figure 7:
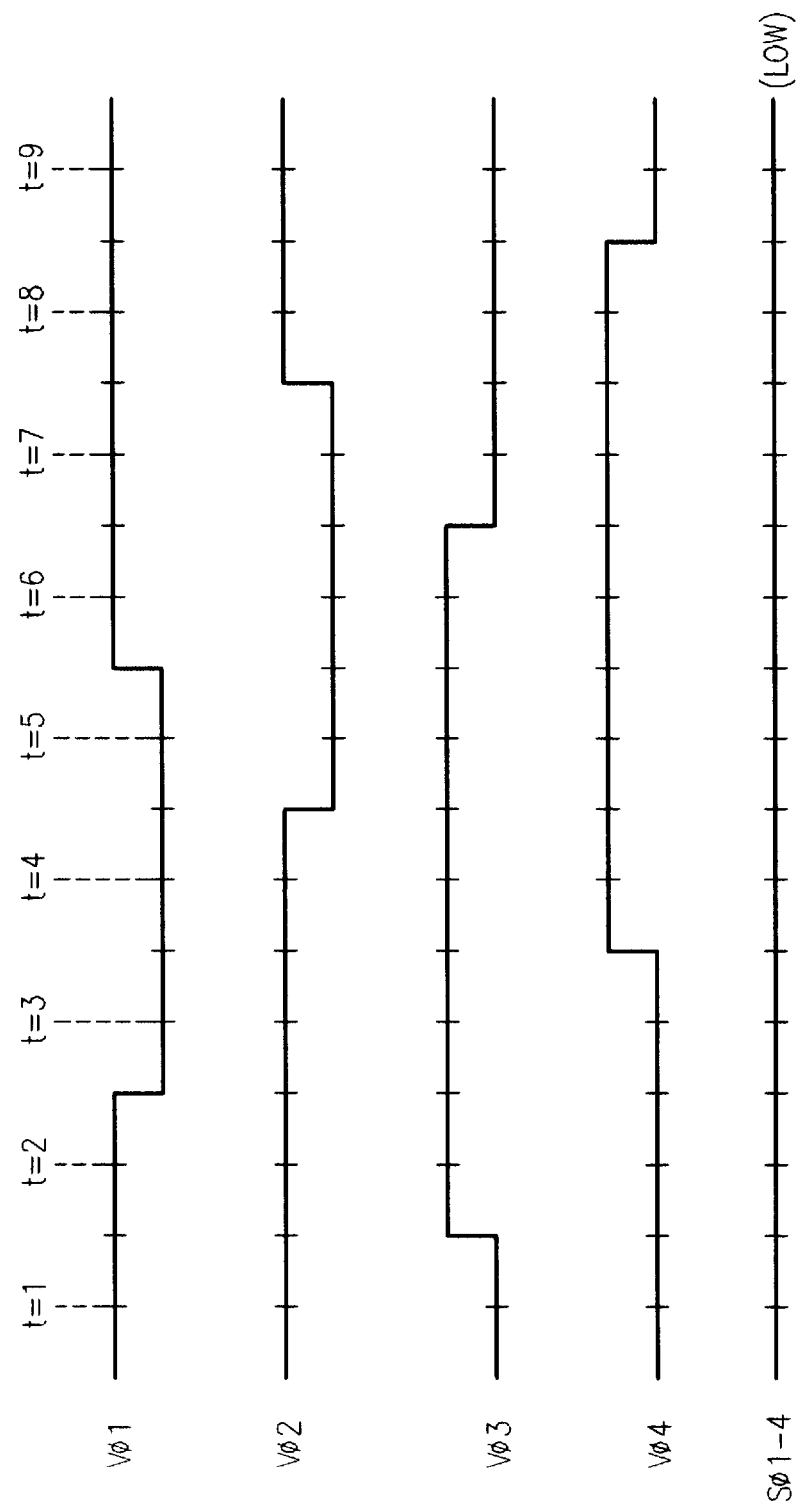
FIG. 7 is a driving timing diagram of a vertical transfer clock according to the present invention.
Figure 8A:
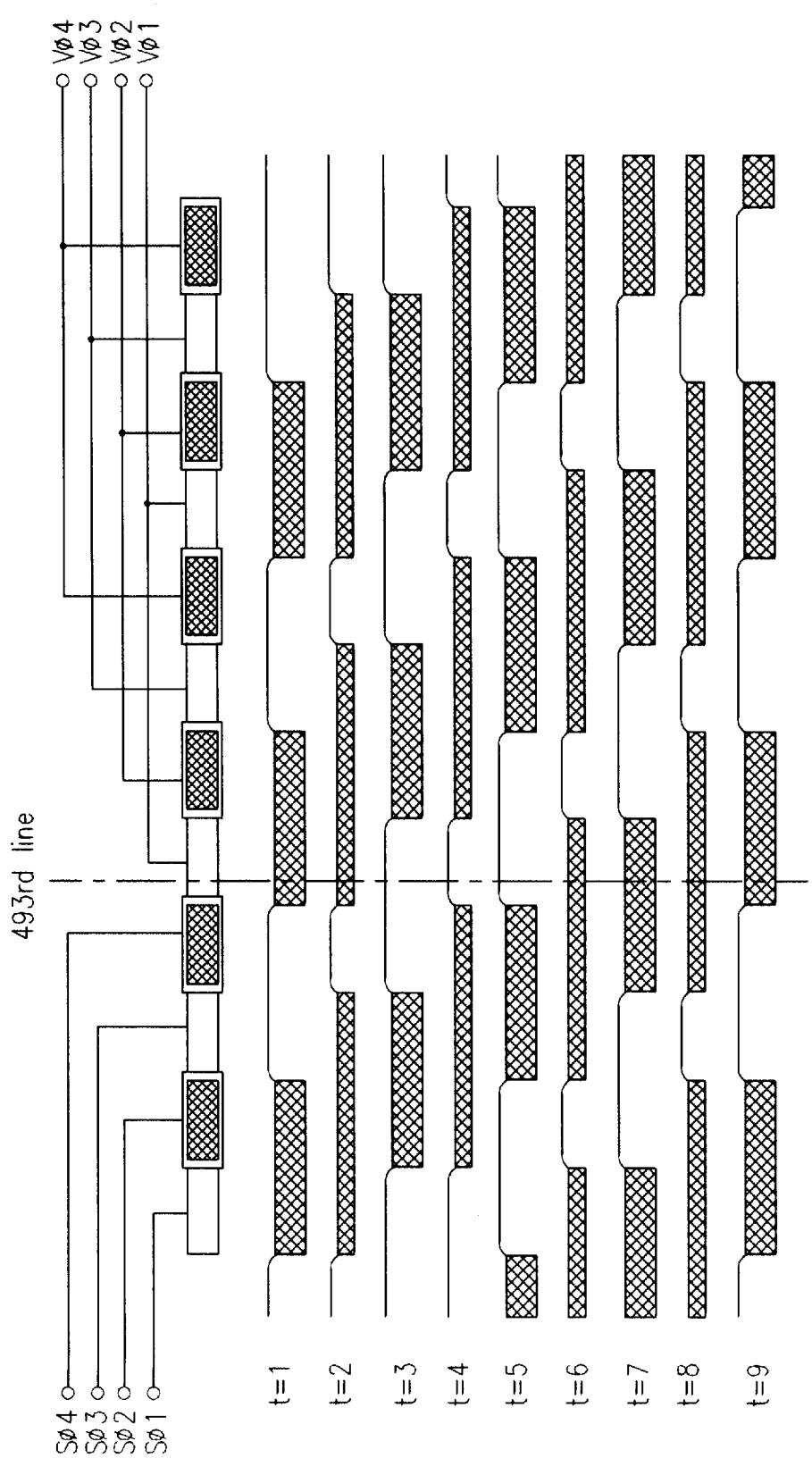
FIGS. 8A and 8B show potential levels according to the charge transfer of CCIR and EIA modes in accordance with the present invention, respectively.
Figure 8B:
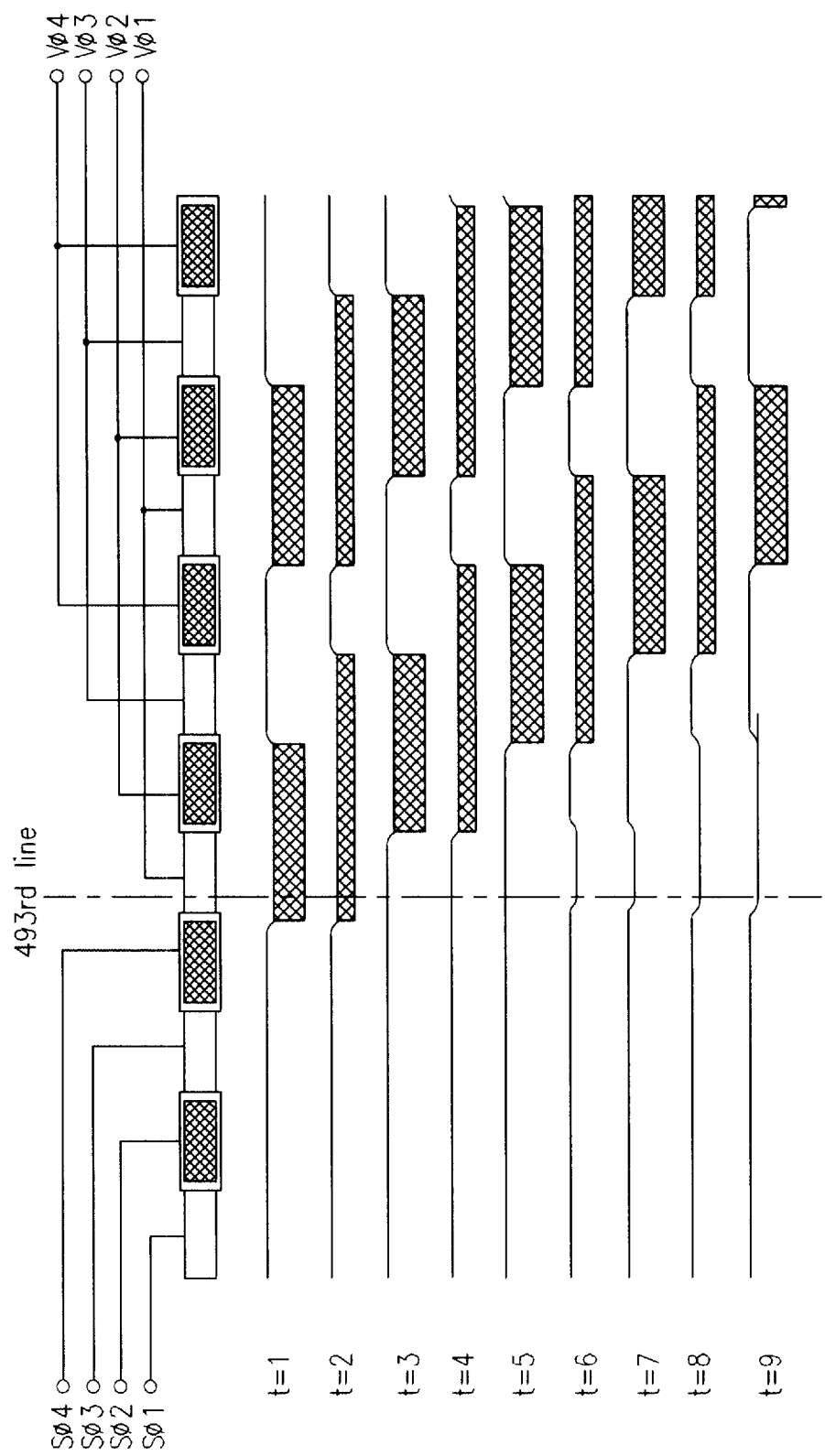

FIG. 7 is a timing diagram of the transfer clock signal for vertical charge transfer according to the present invention, FIG. 8A shows a potential level corresponding to the vertical charge transfer flow of the CCIR mode according to the transfer clock timing of FIG. 7, and FIG. 8B shows a potential level corresponding to showing the vertical charge transfer flow of the EIA mode according to the transfer clock timing of FIG. 7. FIG. 8A shows a charge flow in case that the vertical transfer clock selecting portion is operated, which controls the vertical transfer clock. Since the number of pixels of the CCD of the present invention is as many as that of CCIR mode CCD, the vertical transfer clock signal applied by the operation of vertical transfer clock selecting portion 55 is output without any change. Accordingly, the image signal charges accumulated in respective pixels are transmitted to VCCD region 52.

However, in order to apply the CCD of the present invention to the EIA mode, it is required that the output state of vertical transfer clock selecting portion 55 becomes logic "low" so as not to apply the vertical transfer clock signal to the spare pixel lines by the control of vertical transfer clock selecting portion 55. That is, the vertical transfer clock signal is controlled from the 493rd vertical line of the CCD of the present invention to prevent the image signal charges accumulated in the respective pixels from being moved from 493rd vertical line to VCCD region 52. Here, vertical transfer clock selecting portion 55 is formed on the opposite side to HCCD region 53, thereby controlling from the upper pixel lines to the final spare pixel line (that is, 584–493 lines).

FIG. 8B illustrates a potential level showing the vertical charge transfer flow of the EIA mode according to the transfer clock timing of FIG. 7. FIG. 8B shows a potential level in case that the vertical transfer clock selecting portion is turned-off to cut off the transfer clock signal applied to the pixel lines, starting from the 493rd line vertically. Since the supply and cut-off operations of the transfer clock to the spare pixel lines are determined according to the on/off of vertical transfer clock selecting portion 55, the output of vertical transfer clock selecting portion 55 is to become logic "low".

As shown in FIGS. 6 and 8B, vertical transfer clock selecting portion 55 is turn-off to cut off the supply of the vertical transfer clock signal from the 493rd vertical line among the vertical transfer clock signals. This is performed by turning off the transfer gate of vertical transfer clock selecting portion 55. Consequently, only the charges, which are accumulated in the pixels corresponding to the vertical line to the 492nd line, are moved to VCCD region 52 according to the vertical transfer clock. Accordingly, to the 492nd vertical line, the charges are moved to VCCD region 52 according to the transfer clock signal in accordance with the respective timings. From the 493rd vertical line, the potential level is always in "high" state because there is no vertical transfer clock signal.

According to the present invention, in case that the CCD for CCIR mode is used for EIA mode, it is possible for the CCD to be flexibly used according only to mode conversion without the replacement of the CCD.

Therefore, it should be understood that the present invention is not limited to the particular embodiments disclosed herein as the best mode contemplated for carrying out the present invention, and that the present invention is not limited to the specific embodiments described in this specification except as defined in the appended claims.

What is claimed is:

1. A charge coupled device having a CCIR/EIA mode conversion function, said device comprising:

a plurality of VCCD regions formed in the direction of row, said VCCD regions having a predetermined interval from one another;

a plurality of HCCD regions formed at the end of said VCCD regions in the direction of column;

a plurality of photodetectors regularly arranged between said VCCD regions, said photodetectors generating signal charges according to an image signal;

a plurality of vertical gate electrodes formed on said VCCD regions and said photodetectors in the direction of column, said vertical gate electrodes transmitting said signal charges of said photodetectors to said HCCD regions through said VCCD regions according to applied vertical clock signals;

vertical clock signal generating means for supplying a predetermined number of vertical clock signals; and selecting means for receiving vertical clock signals from said vertical clock signal generating means, said selecting means supplying said vertical clock signals to part of said vertical gate electrodes, or supplying disable signals instead of said vertical clock signals, according to an external selection signal.

2. The charge coupled device as claimed in claim 1, wherein said external selection signal corresponds to a CCIR mode or EIA mode.

3. The charge coupled device as claimed in claim 1, wherein said selecting means is a switch having a CMOS transistor.

* * * * *